United States Patent
Huang et al.

(10) Patent No.: US 9,112,065 B2
(45) Date of Patent: Aug. 18, 2015

(54) METHOD OF CURING SOLAR CELLS TO REDUCE LAMINATION INDUCED EFFICIENCY LOSS

(71) Applicant: TSMC Solar Ltd., Taichung (TW)

(72) Inventors: Yi-Feng Huang, Kaohsiung (TW); Chia-Juei Pan, Taichung (TW); Kwang-Ming Lin, Hsin-Chu (TW)

(73) Assignee: TSMC Solar Ltd., Taichung (TW)

( * ) Notice: Subject to any disclaimer, the term of this patent is extended or adjusted under 35 U.S.C. 154(b) by 0 days.

(21) Appl. No.: 13/826,191

(22) Filed: Mar. 14, 2013

(65) Prior Publication Data
US 2014/0273305 A1 Sep. 18, 2014

(51) Int. Cl.
| H01L 31/042 | (2014.01) |
| H01L 31/0203 | (2014.01) |
| H01L 31/048 | (2014.01) |
| H01L 31/0749 | (2012.01) |

(52) U.S. Cl.
CPC .......... *H01L 31/0203* (2013.01); *H01L 31/048* (2013.01); *H01L 31/0749* (2013.01); *Y02E 10/541* (2013.01)

(58) Field of Classification Search
CPC ................. H01L 31/02008; H01L 31/022425; H01L 31/0322; H01L 31/048; H01L 31/0749
See application file for complete search history.

(56) References Cited

U.S. PATENT DOCUMENTS

| 2006/0207646 A1* | 9/2006 | Terreau et al. .............. 136/251 |
| 2009/0159129 A1* | 6/2009 | Kataoka et al. .............. 136/259 |
| 2009/0266399 A1* | 10/2009 | Basol et al. .................. 136/244 |
| 2013/0122616 A1* | 5/2013 | Degroot et al. ................ 438/17 |

FOREIGN PATENT DOCUMENTS

WO    WO-2012/016101 A1    2/2012

OTHER PUBLICATIONS

Britt et al., "CIGS Device Stability on Flexible Substrates," *Conference Record of the 2006 IEEE 4th World Conference on Photovoltaic Energy Conversion*, 2006, 1:352-355.
Igalson et al., "The change of the electronic properties of CIGS devices induced by the 'damp heat' treatment," *Thin Solid Films*, 2002, vol. 1, 403-404:320-324.
Communication dated Nov. 13, 2013, from related German Patent Application No. 10-2013-105977.5, 8 pages.

* cited by examiner

*Primary Examiner* — Brett Feeney
*Assistant Examiner* — Pamela E Perkins
(74) *Attorney, Agent, or Firm* — Duane Morris LLP

(57) ABSTRACT

A method for encapsulating solar cells includes a curing step that renders CIGS or other types of solar cell absorber layers resistant to degradation by high-temperature lamination processes. The curing process takes place after IV test and prior to the lamination of an encapsulant film. The curing step is carried out in conjunction with a light soaking step that takes place prior to the IV test. The curing process takes place for a time that may range from 10 minutes to two days and at a high relative humidity, RH. Relative humidities of 20-90% are used and have been effective in passivating selenium vacancy defects associated with the absorber layers. The cured absorber layers are resistant to degradation and produce a solar cell with a high solar cell efficiency.

20 Claims, 2 Drawing Sheets

US 9,112,065 B2

METHOD OF CURING SOLAR CELLS TO REDUCE LAMINATION INDUCED EFFICIENCY LOSS

TECHNICAL FIELD

The disclosure relates most generally to solar cells, methods for manufacturing and laminating solar cells, and more particularly, methods for light soaking and curing solar cells in conjunction with the lamination process.

BACKGROUND

Solar cells are photovoltaic components for direct generation of electrical current from sunlight. Due to the growing demand for clean sources of energy, the manufacture of solar cells has expanded dramatically in recent years and continues to expand. Various types of solar cells exist and continue to be developed. Solar cells include absorber layers that absorb the sunlight that is converted into electrical current. The quality and performance of the absorber layer is therefore of paramount importance. The composition, structure, and integrity of the absorber layer materials are critically important in the solar cell. In order to maximize the efficiency of electrical current production, the absorber layer must be resistant to degradation.

One particularly popular type of absorber material is a CIGS-based absorber material. CIGS—copper indium gallium selenide, $Cu(In,Ga)Se_2$—is a popular chalcogenide semiconductor material and CIGS-based materials find use in various applications, but are particularly useful and favored as absorber layers in solar cells.

Solar cells are encapsulated to protect them from the outdoor environment and to prevent degradation of the solar cell materials. The encapsulation process typically involves laminating an encapsulating film on the solar cell. The lamination process involves high temperature processing and often creates power loss in the solar cells, commonly referred to as LIPL—lamination induced power loss. LIPL is also indicative of a decrease in efficiency of the solar cell such as when a given amount of sunlight produces less electrical current and therefore less power. It is generally believed that LIPL is often attributable to a degradation of the sheet resistance of the absorber layer. CIGS-type solar cells are particularly vulnerable to lamination induced power loss which has been known to produce a power loss ranging from about 8% to about 15% and which undermines CIGS-type solar module performance considerably. Attempts at mitigating LIPL have generally been directed to focusing on the encapsulation, i.e. lamination process itself, but such efforts have been ineffective and may sacrifice the reliability of the encapsulation.

Methods for laminating solar cells without inducing power loss are needed.

BRIEF DESCRIPTION OF THE DRAWING

The present disclosure is best understood from the following detailed description when read in conjunction with the accompanying drawing. It is emphasized that, according to common practice, the various features of the drawing are not necessarily to scale. On the contrary, the dimensions of the various features are arbitrarily expanded or reduced for clarity. Like numerals denote like features throughout the specification and drawing.

DETAILED DESCRIPTION OF EMBODIMENTS OF THE DISCLOSURE

Figure 1:
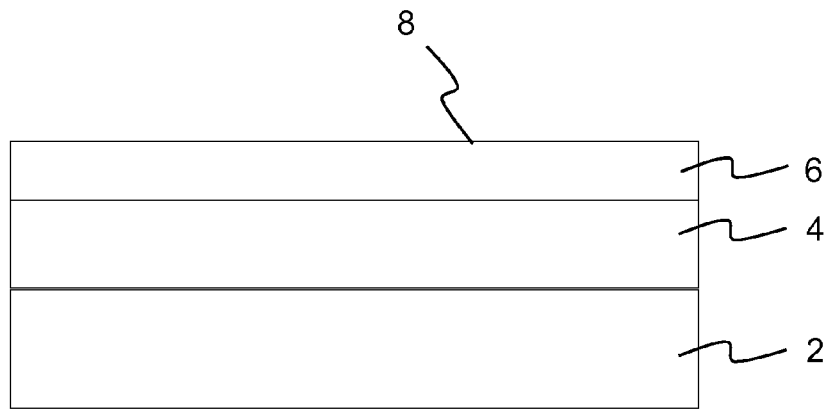
FIG. 1 is a cross sectional view of a solar cell subjected to processing according to an embodiment of the disclosure.

The disclosure is directed to encapsulating and covering a solar cell using a lamination process. The disclosure is also directed to treating an absorber layer of a solar cell such that the absorber layer becomes immune to lamination induced defects and deterioration. This approach involves curing the solar cell in contrast to changing parameters and conditions of the lamination process itself and the methods of the disclosure are therefore compatible with various lamination processes. The methods of the disclosure have been discovered to be particularly useful for solar cells with CIGS absorber layers. CIGS absorber layers are known to include selenium vacancy ($V_{SE}$) defects either inherently or created through processing. An abundance of selenium vacancy defects degrades solar cell efficiency and effectiveness. In one embodiment, light soaking is used to passivate such selenium vacancy ($V_{SE}$) defects. It has been found, however, that thermal annealing depassivates defects that light soaking can passivate, such as $V_{SE}$ defects. The lamination processes take place at elevated temperatures and therefore effectively act as annealing operations. The depassivation associated with the lamination process causes a change in CIGS absorber layer properties that degrades the solar cell efficiency. One such absorber layer property that degrades is sheet resistance, which often increases during lamination processes.

Many solar cells undergo laser edge deletion ("ED") processes which involve directing a laser beam to edges and other portions of the panel upon which the solar cell substrates are formed. Laser edge deletion is used to clean the edges of solar cells in many embodiments and provides electrical separation between the solar cells and other components or between individual solar cells in many embodiments. Applicants have discovered that the ED process changes CIGS absorber layer properties and renders the CIGS absorber layer more vulnerable to LIPL during subsequent lamination processes.

Aspects of the disclosure remedy the susceptibility of solar cells to high-temperature thermal operations such as annealing and high-temperature lamination processes. According to aspects of the disclosure, a solar cell is provided. The solar cell is a CIGS-type solar cell in some embodiments but other solar cell types are used in other embodiments. The solar cell includes the absorber layer formed over a substrate and/or over a back electrode layer. The absorber layer is formed directly on the substrate and/or back electrode layer in some embodiments and over other interceding layers formed on the substrate in other embodiments. The interceding layers include barrier layers and additional back electrodes in some embodiments. Various films are also formed over the absorber layer in various embodiments. TCO, transparent conductive oxides, are formed over the absorber layer in some embodiments but other materials and other films such as buffer layers or barrier layers are formed over or under the absorber layer in other embodiments.

FIG. 1 shows a cross-sectional view of a prepared solar cell as described above and ready for processing according to the disclosure. Absorber layer 4 is disposed over substrate 2. Substrate 2 is a semiconductor material such as silicon in some embodiments and substrate 2 includes or is formed of one or more back electrode layers such as molybdenum, in other embodiments. In some embodiments, additional layers of material such as barrier layers or buffer layers are interposed between absorber layer 4 and substrate 2. Absorber layer 4 is a CIGS absorber layer in various embodiments, but other absorber layers are used in other embodiments. Transparent conductive oxide ("TCO") layer 6 is disposed over absorber layer 4 in the illustrated embodiment. In the illustrated embodiment, TCO layer 6 is shown as formed directly on absorber layer 4, but in other embodiments, TCO layer 6 is formed over absorber layer 4 with interceding layers such as barrier layers or buffer layers interposed between TCO layer 6 and absorber layer 4. Various deposition and other film formation methods are used to form the described films, in various embodiments. Chemical vapor deposition, CVD, is one such method, but various other methods are used in other embodiments. Surface 8 is the exposed upper surface of TCO layer 6.

Figure 2:
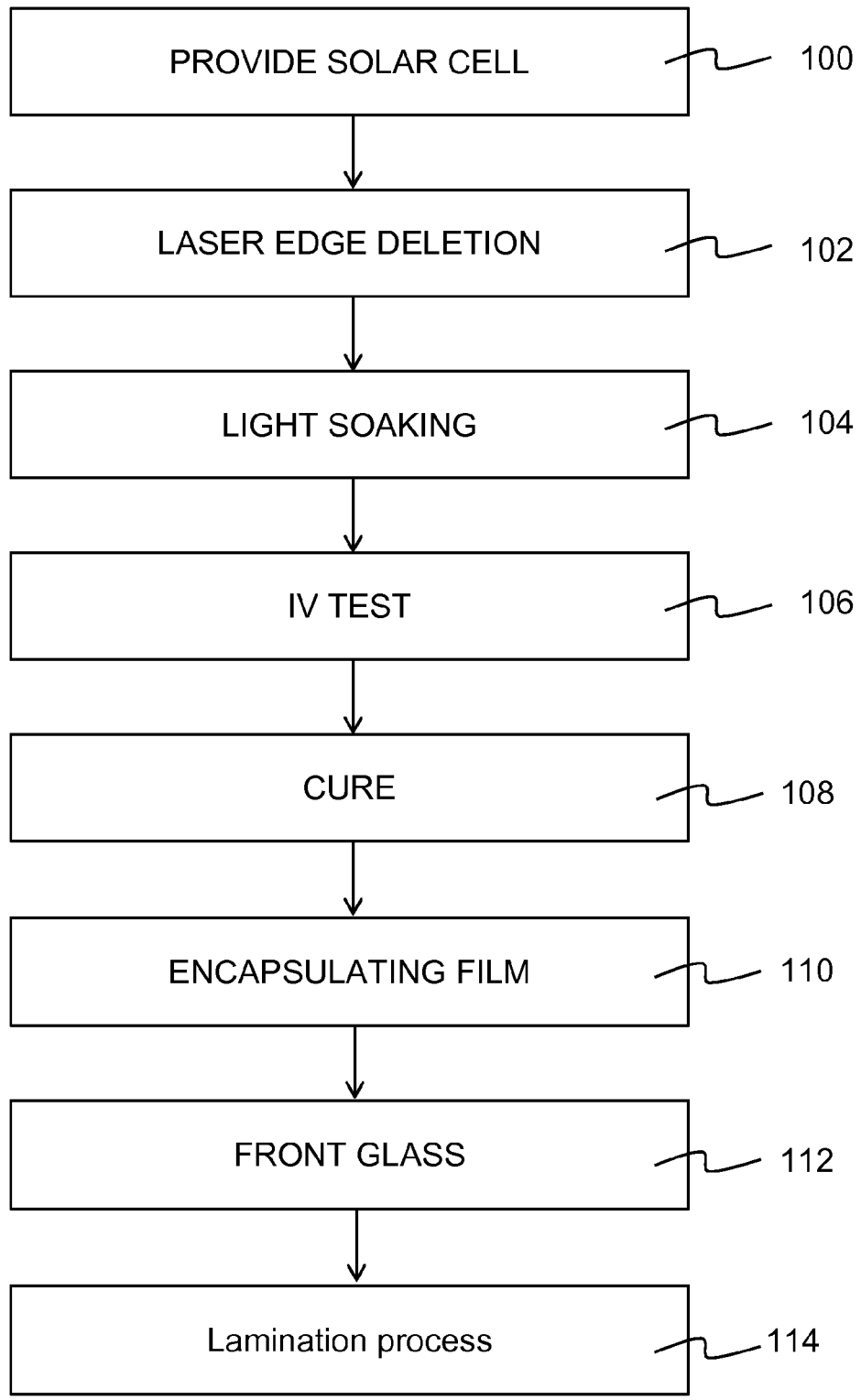
FIG. 2 is a flowchart of a method for laminating a solar cell according to an embodiment of the disclosure.

Now referring to FIG. 2, at step 100, a fabricated solar cell such as shown in FIG. 1, is provided. The fabricated solar cell includes all of the material layers formed according to various deposition and other fabrication processes, as discussed above. At provide solar cell step 100, the fabrication operations are complete and the solar cell such as shown in FIG. 1 is ready for lamination and other assembly operations. At laser edge deletion step 102, a laser is used to clean the edges of the panel or substrate upon which the solar cell is disposed. Laser edge deletion step 102 also is used to provide separation between individual solar cell regions in some embodiments. Various other laser treatments are used in various embodiments. Various laser conditions are used in various embodiments. In some embodiments, laser edge deletion step 102 is not used.

At light soaking step 104, the solar cell undergoes light soaking. Various techniques and various apparatuses may be used to irradiate the solar cell with light. Various radiation wavelengths of light are used, various types of lights are used and various conditions are used in various embodiments. In some embodiments, the light used emulates, in a more intense manner, the operating condition of the solar cell; thus, the light may be a full spectrum light emulating sunlight at an intensity about or higher than a midday summer sunlight. In some embodiments, light soaking step 104 takes place at room temperature, but in other embodiments light soaking step 104 takes place at temperatures lower or higher than room temperature, for example about 15-60° C. Light soaking step 104 takes place for about 1-30 minutes in one embodiment. Light soaking step 104 takes place for about 30 minutes to about two hours in other embodiments, and still other times are used in other embodiments. Light soaking step 104 takes place for various lengths of time in other embodiments and is at least partially determined by the intensity, wavelength and type of light used to irradiate and expose, i.e. soak, the solar cell.

IV test step 106 follows light soaking step 104 in some embodiments. In some embodiments, IV test 106 takes place simultaneously with light soaking step 104. The IV test is a current (I)-voltage (V) test in which characteristic IV curves of the solar cell are generated and analyzed. The IV test involves the use of a light source, measurement electronics, a processor and various software that measures and analyzes solar cell I-V curves under various conditions in various embodiments. Various solar cell I-V measurement systems include a solar simulator that illuminates the solar cell test device while the electronic load sweeps the cell voltage from a reverse-bias condition through the power quadrant and beyond $V_{OC}$ (open-circuit voltage) but other analytical testing methods are used in other embodiments. Based on the characteristics of the I-V curves generated, IV test 106 is used to determine solar cell efficiency in one embodiment. In other embodiments, IV test 106 is used to measure various parameters including but not limited to the $V_{OC}$ (open-circuit voltage), $I_{SC}$ (short-circuit current), $J_{SC}$ (short-circuit current density), $V_{MAX}$ (maximum voltage), $I_{MAX}$ (maximum current) and $P_{MAX}$ (maximum power).

Following IV test step 106 is cure step 108. Cure step 108 includes curing the solar cell in a high moisture environment. In some embodiments, the curing takes place for a period of time of about 10 minutes to one hour and in some embodiments, the curing takes place for a period of time of about 10 minutes to more than 2 days. In one embodiment, a curing step of about one hour is used. In some embodiments a curing time of 1 day or greater is used. The curing step takes place at room temperature in some embodiments but the temperature may be higher, for example, range from about 25° C. to about 80° C. in various other embodiments. In one embodiment, the relative humidity (RH) is about 70% and in some embodiments, a RH between about 20% and 90% is used. In one embodiment, a relative humidity of about 45-65% RH is used. Various relative humidity values are used for durations in various embodiments. In one embodiment, a relative humidity of about 10-30% RH is used and in another embodiment a relative humidity of about 30-50%, 50-60% or 60-80% RH is used. In one particular embodiment, a relative humidity in the range of about 50% RH to about 90% RH for one hour is used. In other embodiments, a typical curing time is about 30 hours. Relative humidity is the ratio of the partial pressure of water vapor in an air-water mixture to the saturated vapor pressure of water at a given temperature. One device used for measuring the humidity of air is a hygrometer.

In some embodiments, the relative humidity is varied during the curing process, in some embodiments the temperature is varied during the curing process, and in some embodiments both the relative humidity and the temperature are varied during the curing process step. In some embodiments, either or both of the relative humidity and temperature are changed gradually. In some embodiments, either or both of the relative humidity and temperature are changed incrementally. In some embodiments, the temperature is increased during the curing step, and in other embodiments, the temperature is decreased during the curing step. In some embodiments, the relative humidity is increased during the curing step, and in other embodiments, the relative humidity is decreased during the curing step. In still other embodiments, either or both of the temperature and relative humidity are increased to a maximum, then decreased, during the curing step. In some embodiments, either or both of the temperature and relative humidity are decreased to a minimum, then increased during the curing step. Various combinations of parameters of relative humidity, temperature and duration, are used in various embodiments.

It has been discovered that the curing process improves solar cell efficiency and renders the solar cell, particularly the absorber layer, resistant to degradation and de-passivation. Further, the curing process renders the solar cell resistant to degradation and de-passivation in a manner faster than might be eventually achieved in ambient conditions. When a high relative humidity value is used in cure step 108, the curing process is of a short duration. As such, a time savings is achieved relative to curing in an ambient environment. In some embodiments in which a high relative humidity is used, a time savings is achieved because a curing process with a time of about one hour using the high relative humidity according to the disclosure, has comparable results to curing in an ambient environment for about 30 hours.

In some embodiments, although not shown in FIG. 2, IV test 106 is carried out after cure step 108. In some embodiments, although not shown in FIG. 2, IV test 106 is carried out before cure step 108 and optionally repeated after cure step 108. According to embodiments in which IV test 106 is carried out both before and after cure step 108, the data taken before and after cure step 108 can be used to evaluate the effects of cure step 108 upon the various parameters such as but not limited to $V_{OC}$ (open-circuit voltage), solar cell efficiency, $I_{SC}$ (short-circuit current), $J_{SC}$ (short-circuit current density), $V_{MAX}$ (maximum voltage), $I_{MAX}$ (maximum current) or $P_{MAX}$ (maximum power). In other embodiments, IV test 106 is not repeated and encapsulating film lamination step 110 follows cure step 108.

Various lamination processes are used to encapsulate the solar cell by laminating an encapsulating film on the solar cell. In some embodiments, the solar cell is laminated with an EVA, ethylene-vinyl acetate, film deposited over the solar cell structure shown in FIG. 1. Various other suitable polymer materials are used as the encapsulant in other embodiments. In other embodiments, the encapsulating film is another transparent layer such as an ethylene-methyl acrylate copolymer, an ethylene-ethyl acrylate copolymer, an ethylene-ethyl acrylate-maleic anhydride copolymer, a urethane resin, a butyral resin, a silicone resin, a polyamide resin, a polyester thermoplastic elastomer, a polyolefin thermoplastic elastomer, a polyurethane thermoplastic elastomer, a polyamide thermoplastic elastomer, polyethylene having epoxy groups, a fluororubber, a fluoropolymer and the like. Other suitable materials that are transparent, flexible, adhesive and inexpensive are used in other embodiments.

In some embodiments, the lamination process involves maintaining the solar cell at a temperature of about 120° C. but various other temperatures are used in other embodiments. Temperatures ranging from about 100° C. to about 160° C. are used in other embodiments. The encapsulating film on lamination step 110 is a pressurized step in most embodiments and includes a pressure that is greater than STP, standard temperature and pressure (absolute pressure of 100 kPa, 14.504 psi, 0.986 atm). In other embodiments, a pressure of about 20 kPa to about 80 kPa is used. The lamination step lasts about 30 minutes in one embodiment but various other durations may be used. In some embodiments, the lamination process lasts about 10 minutes to 2 hours. In some embodiments, solid sheets of the encapsulating film are provided and cured to cause the encapsulating film to adhere to the solar cell and in some embodiments, the encapsulating material is liquid at room temperature (20° C.+/−5° C.) and the liquid is cured using radiation such as UV radiation to form the encapsulating film. In some embodiments, ambient pressure is used, although other pressures can also be used.

Figure 3:
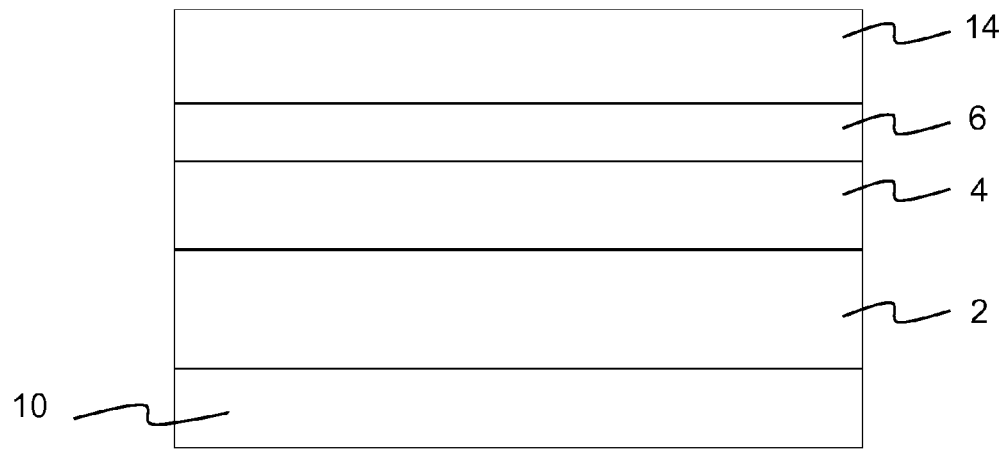
FIG. 3 is a cross sectional view of a solar cell laminated according to embodiments of the disclosure.

Encapsulant film 10 is shown in FIG. 3 and is formed to various thicknesses in various embodiments. In various embodiments, encapsulant film 10 includes a thickness ranging from about 0.2 millimeters to about 5 millimeters.

Referring again to FIG. 2, front glass step 112 follows encapsulating film lamination step 110 in one embodiment. In front glass step 112, a glass pane, typically a tempered glass sheet, is disposed as a cover over the front of the solar cell, which is the opposite surface of the solar cell, with respect to encapsulant film 10. In another embodiment, encapsulating film lamination step 110 is not used and the encapsulation takes place after the front glass step 112, at Lamination process step 114. Either or both of encapsulating film lamination step 110 and Lamination process step 114 are used in various embodiments. According to the embodiment in which Lamination process step 114 is used after front glass step 112, the encapsulant film 10 also covers and encapsulates front glass 14. Various methods for securing a glass pane cover on the solar cell may be used. The glass pane cover or other suitable transparent material is used to protect and cover the solar cells formed on the substrate and various mechanical members such as clamps and brackets are used in various embodiments. The solar cell is now ready for further assembly. One embodiment of front glass 14 without an encapsulating film thereover, is shown in FIG. 3.

According to one aspect, a method for encapsulating a solar cell is provided. The method comprises: providing a solar cell; soaking the solar cell with light; curing the solar cell in an environment having a relative humidity of about 20% to about 90%; and laminating a film on the solar cell after the curing.

In some embodiments, the method further comprises covering the solar cell with tempered glass after curing.

In some embodiments, the laminating comprises laminating an ethylene vinyl acetate (EVA) copolymer film on the solar cell.

In some embodiments, the method further comprises disposing a glass pane over the solar cell and wherein an EVA film and the glass pane are on opposed surfaces of the solar cell.

In some embodiments, the laminating takes place at a temperature within the range of about 100° C. to about 140° C. and at a pressure greater than STP (standard temperature and pressure), and the film is an encapsulating film.

In some embodiments, the method further comprises directing a laser beam onto edges of the solar cell to carry out a laser edge deletion process prior to soaking.

In some embodiments, the method further comprises testing the solar cell by carrying out an IV test on the solar cell between the soaking and the curing.

In some embodiments, the carrying out an IV test comprises measuring IV (current-voltage) curves of the solar cell and computing at least one of solar cell efficiency, $V_{OC}$ (open-circuit voltage), $I_{SC}$ (short-circuit current), $J_{SC}$ (short-circuit current density), $V_{MAX}$ (maximum voltage), $I_{MAX}$ (maximum current) and $P_{MAX}$ (maximum power) based on the IV curves.

In some embodiments, the soaking comprises soaking for a time range of about one minute to about 30 minutes.

In some embodiments, the curing takes place for a time within the range of about ten minutes to about two days.

In some embodiments, the curing takes place in an environment having a relative humidity of about 45% to about 65% and the laminating takes place at a temperature within the range of about 100° C. to about 140° C. and at a pressure within a range of about 20 kPa to about 80 kPa.

In some embodiments, the solar cell is a CIGS (copper indium gallium selenide) solar cell and the film is an encapsulating film.

In some embodiments, the solar cell includes a CIGS (copper indium gallium selenide) absorber layer and a TCO (transparent conductive oxide) layer over the absorber layer and the laminating comprises forming a polymeric film on the solar cell.

According to another aspect, a method for encapsulating a solar cell is provided. The method comprises: providing a solar cell with a copper indium gallium selenide (CIGS) absorber layer; testing the solar cell by carrying out at least an IV test on the solar cell; curing the solar cell in an environment having a relative humidity of about 20% to about 90% relative humidity after the testing the solar cell; laminating an encapsulating film on a back side of solar cell after the curing; and disposing a front glass sheet on a front side of the solar cell after laminating.

In some embodiments, the curing takes place at room temperature and for a time within a range of about ten minutes to about one hour, and the method further comprises soaking the solar cell with light before testing.

In some embodiments, the IV test involves exposing the solar cell to a light source.

In some embodiments, the laminating comprises forming an ethylene-vinyl acetate (EVA) copolymer film on the solar cell and the soaking takes place for a time within a range of about one minute to about 30 minutes.

According to yet another aspect, a method for encapsulating a solar cell is provided. The method comprises: providing a solar cell with a copper indium gallium selenide (CIGS) absorber layer; directing a laser beam onto the solar cell to carry out a laser edge deletion process; soaking the solar cell with light; and testing the solar cell after the soaking, by carrying out at least an IV test on the solar cell. The method further comprises curing the solar cell in an environment having a relative humidity of about 50% to about 90% relative humidity after the testing the solar cell; laminating an ethylene-vinyl acetate (EVA) copolymer film on a back side of solar cell after the curing; and disposing a front glass sheet on a front side of the solar cell after the laminating.

In some embodiments, the curing passivates selenium vacancy defects in the CIGS absorber layer and takes place for a time greater than about one day, and the soaking takes place for a time within a range of about 1-30 minutes.

The preceding merely illustrates the principles of the disclosure. It will thus be appreciated that those of ordinary skill in the art will be able to devise various arrangements which, although not explicitly described or shown herein, embody the principles of the disclosure and are included within its spirit and scope. Furthermore, all examples and conditional language recited herein are principally intended expressly to be only for pedagogical purposes and to aid in understanding the principles of the disclosure and the concepts contributed by the inventors to furthering the art, and are to be construed as being without limitation to such specifically recited examples and conditions. Moreover, all statements herein reciting principles, aspects, and embodiments of the disclosure, as well as specific examples thereof, are intended to encompass both structural and functional equivalents thereof. Additionally, it is intended that such equivalents include both currently known equivalents and equivalents developed in the future, i.e., any elements developed that perform the same function, regardless of structure.

This description of the exemplary embodiments is intended to be read in connection with the figures of the accompanying drawing, which are to be considered part of the entire written description. In the description, relative terms such as "lower," "upper," "horizontal," "vertical," "above," "below," "up," "down," "top" and "bottom" as well as derivatives thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise.

Although the disclosure has been described in terms of exemplary embodiments, it is not limited thereto. Rather, the appended claims should be construed broadly, to include other variants and embodiments of the disclosure, which may be made by those of ordinary skill in the art without departing from the scope and range of equivalents of the disclosure.

What is claimed is:

1. A method for encapsulating a solar cell, said method comprising:
   providing a solar cell comprising a copper indium gallium selenide (CIGS) absorber layer;
   soaking said solar cell with light;
   curing said solar cell in an environment having a relative humidity of about 20% to about 90% after said soaking, wherein said curing passivates selenium vacancy defects in said CIGS absorber layer and takes place for a time greater than 1 day, and said soaking takes place for a time within a range of about 1-30 minutes; and
   laminating a film on said solar cell after said curing.

2. The method as in claim 1, further comprising covering said solar cell with a tempered glass after said curing.

3. The method as in claim 1, wherein said laminating comprises laminating an ethylene vinyl acetate (EVA) copolymer film on said solar cell.

4. The method as in claim 3, further comprising disposing a glass pane over said solar cell and wherein said EVA film and said glass pane are on opposed surfaces of said solar cell.

5. The method as in claim 1, wherein said laminating takes place at a temperature within a range of about 100° C. to about 140° C. and at a pressure greater than STP (standard temperature and pressure), and said film is an encapsulating film.

6. The method as in claim 1, further comprising directing a laser beam onto edges of said solar cell to carry out a laser edge deletion process, prior to said soaking.

7. The method as in claim 1, further comprising testing said solar cell by carrying out an IV test on said solar cell between said soaking and said curing.

8. The method as in claim 7, wherein said carrying out an IV test comprises measuring IV (current-voltage) curves of said solar cell and computing at least one of solar cell efficiency, VOC (open-circuit voltage), ISC (short-circuit current), JSC (short-circuit current density), VMAX (maximum voltage), IMAX (maximum current), and PMAX (maximum power) based on said IV curves.

9. The method as in claim 1, wherein said soaking comprises exposing for a time within a range of about 1 minute to about 30 minutes.

10. The method as in claim 1, wherein said curing takes place for a time within a range of about 10 minutes to about two days.

11. The method as in claim 1, wherein said curing takes place in an environment having a relative humidity of about 50% to about 90%, for about one hour.

12. The method as in claim 1, wherein said solar cell comprises a CIGS (copper indium gallium selenide) solar cell and said film is an encapsulating film.

13. The method as in claim 1, wherein said solar cell includes a CIGS (copper indium gallium selenide) absorber layer and a TCO (transparent conductive oxide) layer over said absorber layer and wherein said laminating comprises forming a polymeric film on said solar cell.

14. A method for encapsulating a solar cell, said method comprising:
   providing a solar cell;
   soaking said solar cell with light;
   curing said solar cell after said soaking, wherein said curing takes place at room temperature and in an environment having a relative humidity of about 45% to about 65%; and laminating a film on said solar cell after said curing, wherein said laminating takes place at a temperature within a range of about 100° C. to about 140° C. and at a pressure within a range of about 20 kPa to about 80 kPa.

15. A method for encapsulating a solar cell, said method comprising:
providing a solar cell with a copper indium gallium selenide (CIGS) absorber layer;
irradiating said solar cell with light;
testing said solar cell by carrying out at least an IV test on said solar cell after said irradiating;
curing said solar cell in an environment having a relative humidity of about 20% to about 90% relative humidity after said testing said solar cell, wherein said curing passivates selenium vacancy defects in said CIGS absorber layer and takes place for a time greater than 1 day, and said soaking takes place for a time within a range of about 1-30 minutes;
laminating an encapsulating film on a back side of said solar cell after said curing; and
disposing a front glass sheet on a front side of said solar cell.

16. The method as in claim 15, wherein said curing takes place at room temperature and for a time within a range of about 10 minutes to about 1 hour.

17. The method as in claim 16, wherein said IV test involves exposing said solar cell to a light source and said laminating takes place after said disposing and includes laminating a further encapsulating film over said front glass sheet.

18. The method as in claim 16, wherein said laminating comprises forming an ethylene-vinyl acetate (EVA) copolymer film on said solar cell and said irradiating takes place for a time within a range of about 1 minute to about 30 minutes.

19. The method as in claim 15, wherein said providing comprises providing said solar cell with an exposed TCO (transparent conductive oxide) surface and said irradiating comprises irradiating said solar cell including said exposed TCO surface.

20. A method for encapsulating a solar cell, said method comprising:
providing a solar cell with a copper indium gallium selenide (CIGS) absorber layer;
directing a laser beam onto an edge portion of said solar cell to carry out a laser edge deletion process;
soaking said solar cell with light;
testing said solar cell after said soaking, by carrying out at least an IV test on said solar cell;
curing said solar cell in an environment having a relative humidity of about 50% to about 90% relative humidity after said testing said solar cell, wherein said curing passivates selenium vacancy defects in said CIGS absorber layer and takes place for a time greater than 1 day, and said soaking takes place for a time within a range of about 1-30 minutes;
laminating an ethylene-vinyl acetate (EVA) copolymer film on a back side of said solar cell after said curing; and
disposing a front glass sheet on a front side of said solar cell after said laminating.

* * * * *